United States Patent
Peizerat et al.

(10) Patent No.: US 7,916,196 B2
(45) Date of Patent: *Mar. 29, 2011

(54) IMAGE SENSING MICROELECTRONIC DEVICE WITH ASYNCHRONOUS ANALOG-TO-DIGITAL CONVERTER

(75) Inventors: Arnaud Peizerat, Grenoble (FR); Marc Arques, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 612 days.

This patent is subject to a terminal disclaimer.

(21) Appl. No.: 11/993,756

(22) PCT Filed: Jun. 29, 2006

(86) PCT No.: PCT/EP2006/063693
§ 371 (c)(1),
(2), (4) Date: Dec. 21, 2007

(87) PCT Pub. No.: WO2007/003577
PCT Pub. Date: Jan. 11, 2007

(65) Prior Publication Data
US 2010/0194951 A1  Aug. 5, 2010

(30) Foreign Application Priority Data
Jul. 1, 2005  (FR) ...................................... 05 52007

(51) Int. Cl.
*H04N 5/335* (2006.01)
(52) U.S. Cl. ....................................... 348/306; 324/678
(58) Field of Classification Search .................. 348/306; 324/678
See application file for complete search history.

(56) References Cited

U.S. PATENT DOCUMENTS

| | | | |
|---|---|---|---|
| 4,833,515 A * | 5/1989 | Baker | 348/297 |
| 5,461,425 A | 10/1995 | Fowler et al. | |
| 6,130,713 A | 10/2000 | Merrill | |
| 7,541,964 B2 * | 6/2009 | Peizerat | 341/172 |
| 2002/0101528 A1 * | 8/2002 | Lee et al. | 348/304 |
| 2007/0285300 A1 | 12/2007 | Peizerat | |

OTHER PUBLICATIONS

Bedabrata Pain, et al., "Approaches and analysis for on-focal-plane analog-to-digital conversion", SPIE, vol. 2226, 1994, pp. 208-218.
Lisa G. McIlrath, "A Low-Power Low-Noise Ultrawide-Dynamic-Range CMOS Imager with Pixel-Parallel A/D Conversion", IEEE, 2001, pp. 846-853.
David X.D. Yang, et al., "A 128×128 Pixel CMOS Area Image Sensor with Multiplexed Pixel Level A/D Conversion", IEEE, Custom Integrated Circuits Conference, 1996, pp. 303-306.

* cited by examiner

*Primary Examiner* — John M Villecco
*Assistant Examiner* — Kent Wang
(74) *Attorney, Agent, or Firm* — Oblon, Spivak, McCelland, Maier & Neustadt, L.L.P.

(57) ABSTRACT

An analog/digital converter device associated with a detector of an image sensor, including: a comparator capable of receiving the analog signal and delivering a two-states output signal, able to adopt, depending on the analog signal, a first stable state or a second state, a charge injector capable of changing the analog signal by injection of at least one quantity of charges into the capacitor, and a mechanism for commanding the charge injector, capable of receiving the two-state signals and capable of triggering, depending on the two-state signals, plural injections of charges between at least two successive changes in state of the signal, from the first state to the second state and from the second state to the first state.

14 Claims, 5 Drawing Sheets

IMAGE SENSING MICROELECTRONIC DEVICE WITH ASYNCHRONOUS ANALOG-TO-DIGITAL CONVERTER

TECHNICAL FIELD

The invention relates to the field of imaging or image-sensing microelectronic devices, notably in CMOS technology, the invention relates to an image-sensing microelectronic device provided with one or several pixels, respectively comprising an analog/digital converter, and in particular an analog/digital converter with enhanced charge injection, either asynchronous or clock-free.

The invention also relates to an enhanced method for digitizing an analog signal, in particular of a current from a detector belonging to an image sensor. With the invention, it is possible to apply analog/digital conversion, within detectors of an image sensor, with an enhanced conversion dynamic range.

PRIOR ART

An imaging or image-sensing microelectronic device is generally formed with a matrix of pixels and an electronic command device. Each pixel comprises a detector, provided for example with at least one photodiode or at least one phototransistor, provided in order to convert the energy of incident photons on the pixel into electron-hole pairs, with an integration capacitance, the role of which is to store these charges, as well as one or more transistors. At the output, the matrix of pixels delivers an analog signal, which the monitoring device is capable of converting into a digital signal. The analog/digital conversion may possibly be carried out inside the chip in which the matrix of pixels is integrated.

The document Eric R. Fossum: <<Approaches and Analysis for on Focal Plane Analog to Digital Conversion>>, SPIE, vol. 2226, 1994, has several alternative imaging devices with a pixel matrix and integrated digitization device(s) in a same chip.

A first alternative comprises a matrix of pixels and an analog/digital conversion device integrated to a same chip, the analog/digital conversion device being located at the end of the matrix.

According to a second alternative, the analog/digital conversion device may be located at the end of each column of the matrix of pixels. As compared with the first alternative, with the second alternative it is possible to obtain a lower consumption of the imager, insofar that the operating frequency of the device is divided by the number of columns of the matrix. With the second alternative, it is also possible to do without an output amplifier and thereby to avoid the noise which such an amplifier would introduce.

A third alternative applies an analog/digital conversion device integrated to each pixel of the matrix. For this third alternative, consumption as well as noise are reduced as compared with the two preceding alternatives.

Document U.S. Pat. No. 5,461,425 discloses an imaging microelectronic device provided with a matrix of pixels delivering analog signals and with a plurality of analog/digital converters integrated on a same integrated circuit chip as the matrix of pixels, each analog/digital converter being associated with one or more pixels, for example with a group of 4 pixels. FIG. 1 illustrates a device according to the prior art formed with a detector associated with an analog/digital converter. The detector comprises at least one photodetector. The digitization device as for it is formed with a synchronous $\Delta\Sigma$ modulator 2, comprising an integration capacitor intended to receive charges, as a current Idet, from the photodetector, a comparator 3 driven by a clock 4. The comparator 3 commands a charge injector 6 connected to an output of the comparator 3 and intended to inject packets of charges into the capacitor 1, at the input of the comparator 3. From the $\Delta\Sigma$ modulator 2, a train of bits stems is emitted, which train may be filtered by means of a digital filter 8, for example a decimator filter located on the outside of a chip into which the pixel matrix and the digitization device are integrated.

This type of digitization device generally has good linearity, but with it, it is only generally possible to reach a relatively low resolution.

The document of L. G. McIlrath: <<A Low Power Low-Noise Ultrawide-Dynamic Range CMOS Imager With Pixel-Parallel A/D Conversion>>, IEEE, JSSCC, vol. 36, No. 5, May 2001, discloses an alternative digitization device integrated to a pixel of an imager, provided with an asynchronous $\Delta\Sigma$ modulator 5, and illustrated in FIG. 2. This modulator $\Delta\Sigma$ 5 comprises a comparator 2, which commands a switch 7 for resetting the level to a reference voltage Vref. A train of bits stems from modulator $\Delta\Sigma$ 5, which train may also be transmitted to a digital filter 8.

With such a device it is possible to obtain a very large dynamic range, for example of the order of 15 to 17 bits. On the other hand, the digitization performed with such a device is dependent on the linearity of the capacitance and has insufficient linearity notably when the detector current Idet from the photodetector is significant.

The problem is posed of finding a novel analog/digital conversion device integrated to a pixel of an imager and including both good linearity and good conversion dynamic range.

DISCUSSION OF THE INVENTION

The invention relates to a microelectronic device comprising: analog/digital conversion means including:
  a comparator capable of receiving an analog signal from an integration capacitor and of delivering a two-states output signal, capable of being, depending on the analog signal, in a first state (so-called <<stable state>>) or in a second state,
  charge injector means capable of changing the analog signal by injecting at least a quantity of charges into the capacitor,
  means for commanding charge injector means, capable of receiving the two-states signal and capable of commanding the injecting means, the command means comprising means for:
  identifying at least one state change of the output signal of the comparator, from the first state to the second state,
  triggering, consecutive to said state change, several injections of charges by the injector as long as the output signal of the comparator remains in the second state.

Triggering of the injections may be performed asynchronously. Triggering may be achieved automatically and asynchronously after said state change.

The analog/digital converting means may be clock-free or asynchronous. The command means may be asynchronous.

Said microelectronic device may be an imaging or image-sensing microelectronic device, also provided with at least one detector formed with at least one photodetector component and including at least one integration capacitor, the integration capacitor being associated with the photodetector and capable of delivering to the analog/digital conversion means, at least one analog signal capable of varying at least according to the quantities of photons received by the photodetector.

According to one possible embodiment of the device, the quantities of charges injected during said injections of charges may be equal to a set quantity of charges $Q_0$.

The analog/digital conversion means according to the invention have an enhanced conversion dynamic range.

The analog/digital conversion means according to the invention allow the comparator to be triggered again or re-triggered when the latter is held in a state which is not its stable state. With the analog/digital conversion means according to the invention, it is possible to avoid untimely blockings of the comparator, notably when the detector delivers a significant current, for example larger than $Q_0/\tau$ with $Q_0$ being a quantity of charges which the injecting means are capable of dumping and $\tau$ being a delay constant of the comparator.

According to a first alternative embodiment, the detector of the microelectronic device according to the invention may be intended for detecting X radiations.

According a second alternative embodiment, the detector of the microelectronic device according to the invention may be intended for detecting infrared radiations.

According to one possibility, the detector may belong to a matrix of detectors. The microelectronic device according to the invention may comprise a plurality of detectors arranged as a matrix. According to one alternative, the microelectronic device according to the invention may comprise a plurality of detectors arranged as a matrix, respectively associated with analog/digital conversion means.

According to one possible embodiment, the command means, when the output signal of the comparator is in the second state just after having been in the first state for a given time, are capable of commanding a number of k (with $k \geq 1$) injections of charges until the output signal of the comparator changes state or passes into the first state, the number k depending on or being a function of a variation amplitude of the analog signal during said given time.

According to a first alternative, the command means of the charge injector means may comprise:
means forming at least one flip-flop,
means forming one or more delay cells,
means forming at least one logic gate.

According to one possibility, the means for commanding the charge injector means may comprise an oscillator commanded by the output signal of the comparator.

According to one alternative, the command means are capable of commanding the injecting means, via at least one first phase signal and at least one second phase signal, the first phase signal and the second phase signal being two-states signals.

According to one possible embodiment of the image-sensing microelectronic device according to the invention, the latter may further comprise: counting means for counting a number of charge injections carried out by the injector, from the first phase signal or/and from the second phase signal.

According to one possible embodiment of the image-sensing microelectronic device, the photodetector component and the analog/digital converter device may be integrated to a same pixel or/and to a same chip or/and belong to a same integrated circuit.

According to one alternative for which the device according to the invention comprises counting means, the photodetector component, the analog/digital converter device and the counting means may be integrated to a same pixel or/and to a same chip or/and belong to a same integrated circuit.

The invention also relates to a method for commanding an analog/digital converter device integrated to an image sensor and associated with a detector formed by at least one photodetector component, the analog/digital converter device including:
at least one integration capacitor,
a comparator capable of receiving an analog signal from an integration capacitor and of delivering a two-states output signal, capable of being, depending on the analog signal, in a first state (so-called <<stable state>>) or in a second state,
charge injector means capable of changing the analog signal by injecting at least one quantity of charges into the capacitor,
means for commanding the charge injector means capable of receiving the two-states signal, the method comprising the steps of:
identifying a state change of the output signal of the comparator from the first state to the second state,
triggering several charge injections consecutive to said state change as long as the output signal of the comparator remains in the second state.

Triggering of the injections may be performed asynchronously. Triggering may be achieved automatically and asynchronously after said state change.

The analog/digital converter device may be clock-free or asynchronous. The command means may be asynchronous.

The quantities of injected charges during said charge injections may be equal.

According to one alternative command method wherein, when said output signal of the comparator is in the second state just after having been in the first state for a given time, the method may comprise: the triggering of a number k, with $k \geq 1$, of charge injections until the two-states signal changes state again, the number k being dependent of a variation amplitude of the analog signal for said given time.

According to one possibility, the method for commanding the analog/digital converter may further comprise: a step for counting the number of charge injections carried out by the injector, via a first phase signal or/and a second phase signal delivered by the command means of the injector.

According to one possibility, the photodetector component may be capable of detecting one radiation from the following radiations: X or infrared radiations.

BRIEF DESCRIPTION OF THE DRAWINGS

The present invention will be understood upon reading the description of given exemplary embodiments, purely as an indication and by no means as a limitation, with reference to the appended drawings wherein.

Identical, similar or equivalent portions of the different figures bear the same numerical references so as to facilitate the transition from one figure to the other.

The different parts illustrated in the figures are not necessarily according to a uniform scale, so as to make the figures more legible.

DETAILED DISCUSSION OF PARTICULAR EMBODIMENTS

Figure 1:
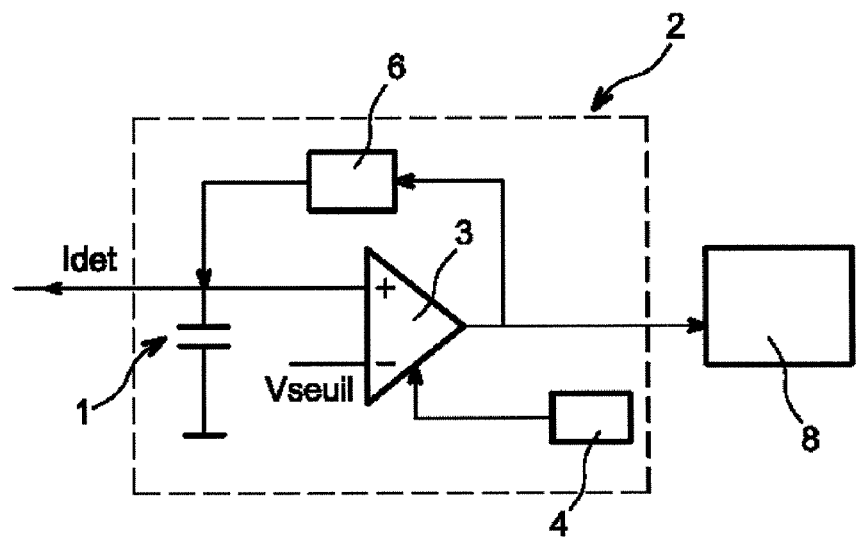
FIG. 1 illustrates a device according to the prior art, provided with a synchronous analog/digital converter and with injection of charges, integrated to a matrix of pixels of an imager or an image sensor.
Figure 2:
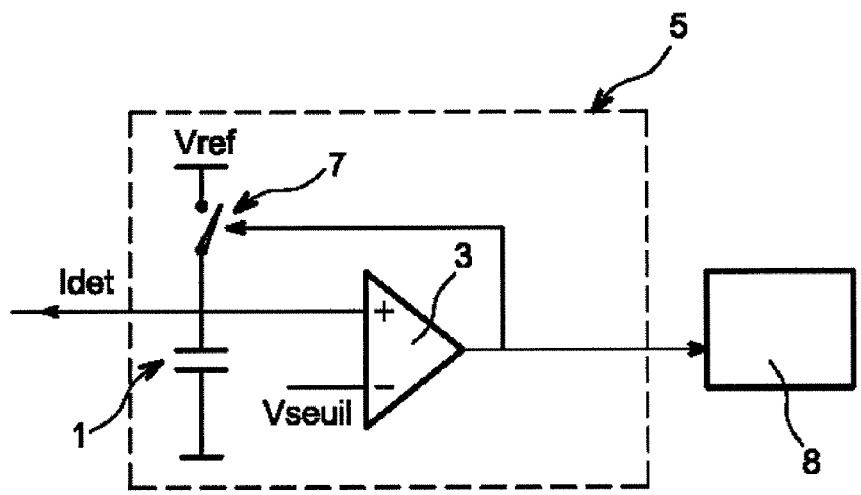
FIG. 2 illustrates a device according to the prior art, provided with an asynchronous analog/digital converter, integrated to a matrix of pixels of an imager or an image sensor.
Figure 3:
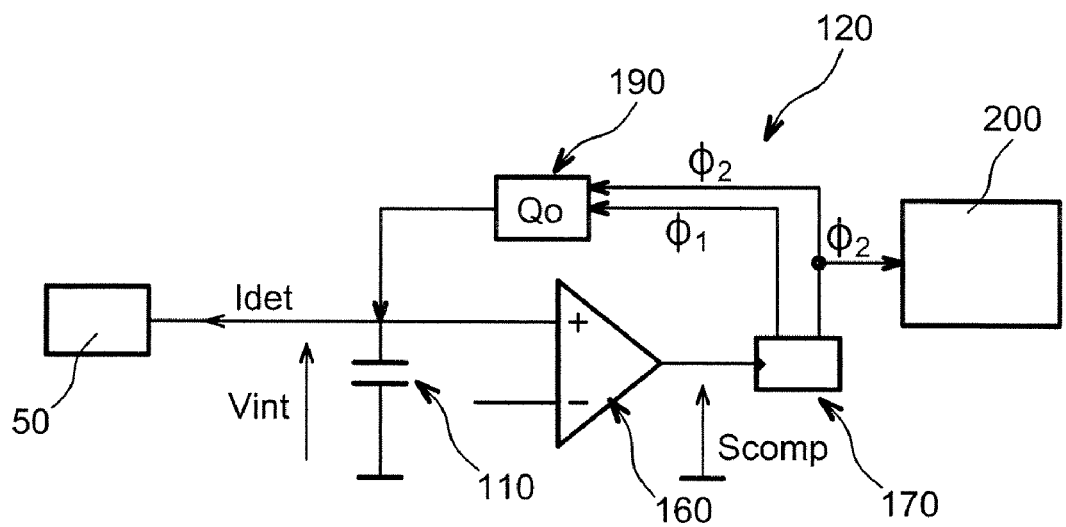
FIG. 3 illustrates an asynchronous analog/digital conversion device and with injection of charges according to the invention, integrated to a matrix of pixels of an imager or an image sensor.

An exemplary digitization or analog/digital conversion device according to the invention belonging to an imaging or image-sensing microelectronic device is illustrated in FIG. 3.

The digitization device is associated with a detector 50 of a pixel of the image sensor device. The digitization device and the detector may be integrated to a same pixel or/and to a same chip or/and to a same medium or/and may belong to a same integrated circuit. According to one alternative, the detector may be assembled or hybridized on the digitization device.

The detector 50 may comprise at least one photodetector component, for example at least one photodiode or at least one phototransistor (not shown in FIG. 3), provided for converting the energy of incident photons on the pixel into electron-hole pairs. According to a first alternative, the photodetector component may be able to carry out detection of X-rays. According to a second alternative, the photodetector component may be able to carry out detection of infrared rays. At the output of the detector 50, is found an integration capacitor 110 of capacitance C, intended to receive charges from the detector 50 as a detection current Idet. A voltage or an analog signal noted as Vint appears on the terminal of the capacitor 110, which is capable of varying, notably according to the detection current Idet, the detection current Idet itself being dependent on or function of a light intensity or of a quantity of photons received by the detector 50.

The digitization device comprises an asynchronous $\Delta\Sigma$ modulator 120 or without any command clock. The modulator $\Delta\Sigma$ 120 may comprise the capacitor 110, a comparator 160, injecting means 190 or a charge injector 190, and command means 170 or a command block 170 of the injector 190.

The comparator 160 is intended to receive the analog signal Vint on one of its inputs, and is provided for carrying out a comparison of this signal Vint with a threshold voltage Vseuil. The result of this comparison is produced at the output of the comparator 160, as a two-states signal noted as Scomp, capable of taking a first state or a second state.

The command block 170 of the injector 190, as for it, is positioned at the output of the comparator 160 and intended to receive as an input, the output signal Scomp of the comparator 160. The command block 170 is clock-free and capable of commanding the injector 190 by means of a first state signal $\Phi1$ and of a second phase signal $\Phi2$; the phase signals $\Phi1$ and $\Phi2$ may also be two-states signals respectively.

The charge injector 190 may be formed with switching means and charge storage means. The storage means are capable of storing a set quantity of charge $Q_0$ when the switching means are blocked or open and they are capable of dumping this fixed quantity of charge $Q_0$ when the switching means are either conducting or closed. The injector 190 is capable of changing the signal Vint, by dumping a fixed charge $Q_0$ or a series of several fixed charges equal to $Q_0$ into the capacitor 110 at the input of the comparator 160.

The analog/digital conversion device is provided for delivering a digital signal to a counter 200. This digital signal may for example be the second phase signal $\Phi2$ or/and the first phase signal $\Phi1$ for commanding the injector 190. The counter 200 may be provided for carrying out a countdown, from the second phase signal $\Phi2$ or/and from the first phase signal $\Phi1$, of a certain number of injections of charges $Q_0$ carried out by the injector 190. This countdown may be carried out over a given time or over a given period. The counter 200 is capable of incrementing a count variable at each charge injection carried out by the injector 190. The count of the number of charge injections $Q_0$ that the injector 190 has carried out, is intended to give an image digital value of the charges from the detector 50. The counter 200, the digitization device and the detector may be integrated to a same pixel or/and to a same chip or/and to a same medium or/and may belong to a same integrated circuit.

Figure 4:
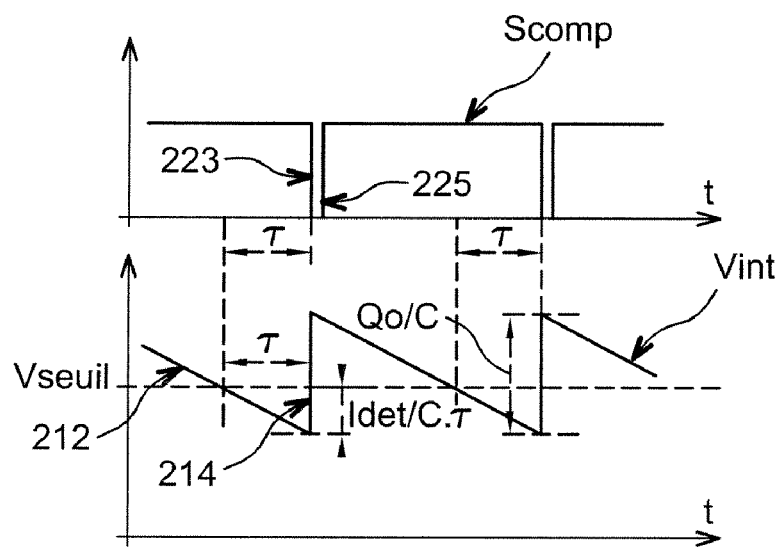
FIG. 4 illustrates input and output signals of a comparator belonging to a digitization device according to the invention positioned at the output of a detector of an imager, for a low output current of the detector.
Figure 6:
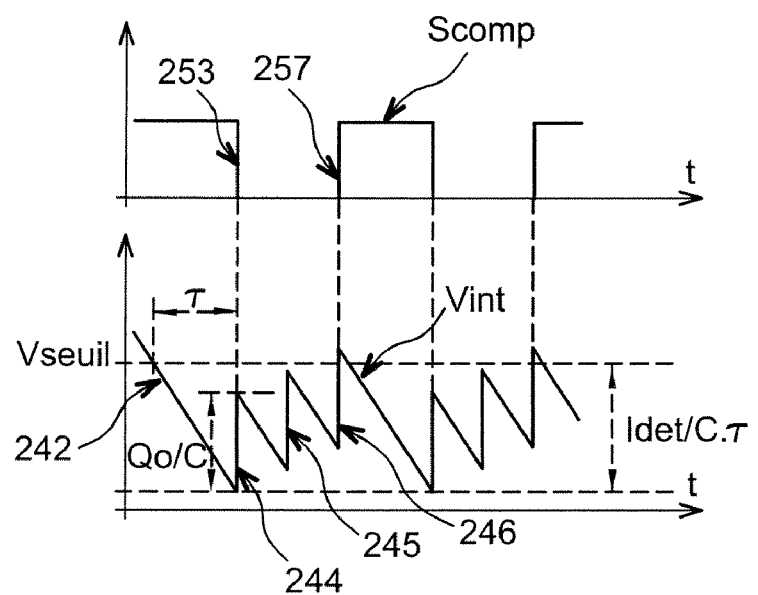
FIG. 6 illustrates input and output signals of a comparator belonging to a digitization device according to the invention positioned at the output of a detector of an imager, for a significant output current of the detector.

FIGS. 4 and 6 illustrate the operation of the digitization device described earlier, via curves representative of the change over time of signals Vint at the input of the comparator 160, and Scomp at the output of the comparator 160.

The digitization device is capable of assuming several operating modes depending on the intensity of the detector current Idet from the detector 50.

A first operating mode of the digitization device is illustrated in FIG. 4, in particular for a detection current Idet belonging to a first range of so-called <<weak>> currents or/and such that $I_{DET}\tau<Q_O$, with $\tau$ being a delay constant for the switching of the comparator and $Q_0$ the fixed quantity of charge capable of being dumped into the capacitor 110 by the injector 190.

According to this first operating mode, when the integration capacitor 110 receives charges from the detector 50, the voltage Vint or the analog signal Vint varies, decreases for example. Such a variation is illustrated for example by a decreasing curve portion 212 in FIG. 4. The amplitude of this variation or the slope of the decreasing curve 212 depends on the intensity of the detection current Idet.

Next, consecutive to this variation, the analog signal or the voltage Vint reaches a certain threshold, for example passes below a threshold voltage noted as Vseuil of the comparator 160. After a delay time noted as $\tau$ after reaching the threshold Vseuil, the signal Scomp switches at the output of the comparator 160. During this switching, the signal Scomp at the output of the comparator passes from a first state (so-called <<stable>> state), for example a high state, to a second state, for example a low state. Such switching is illustrated for example by a falling edge 223 in FIG. 4. The command block 170 is then capable of carrying out detection of the switching or of a state change from the first state to the second state of the Scomp signal.

Next, in order to compensate the preceding variation of the Vint signal, the command block 170 triggers a set charge injection $Q_o$ opposite to this variation. Such an injection of charge may be expressed for example by a rise in the Vint signal (a vertical portion of the curve referenced as 214 in FIG. 4) by a value of the order of $Q_0/C$. Next, a countdown of this injection or an incrementation of the count variable consecutive to this injection is carried out by the counter 200.

In FIG. 4, the rise of the Vint signal caused by the injection, is such that this Vint signal reaches a value above the threshold voltage of the comparator 160 and sufficient to allow the output of the comparator to switch again or allow the signal Scomp to pass from the second state to the first state (rising edge referenced as 225) or again pass to the stable state.

Consecutive to the injection charges, the command block 170 carries out detection of the state of the Scomp signal. The command block 170 may then detect a return to the stable state of the signal Scomp at the output of the comparator 160. The command block 170 consecutive to this detection or return to the stable state, and via the phase signals Φ1 and Φ2, also performs a setting of the injector 190 into a standby mode or setting the injector 190 to a condition in which the latter cannot carry out any injection as long as the Scomp signal is held in the stable state or in the first state.

In the first operating mode, the signal Scomp at the output of the comparator 160 finds its stable state again or passes into the first state again after each charge injection.

The analog/digital conversion device according to the invention may also assume a second operating mode for a detection current Idet belonging to a second range of so-called <<strong>> currents or/and such that $I_{DET}\tau > Q_O$.

Figure 5:
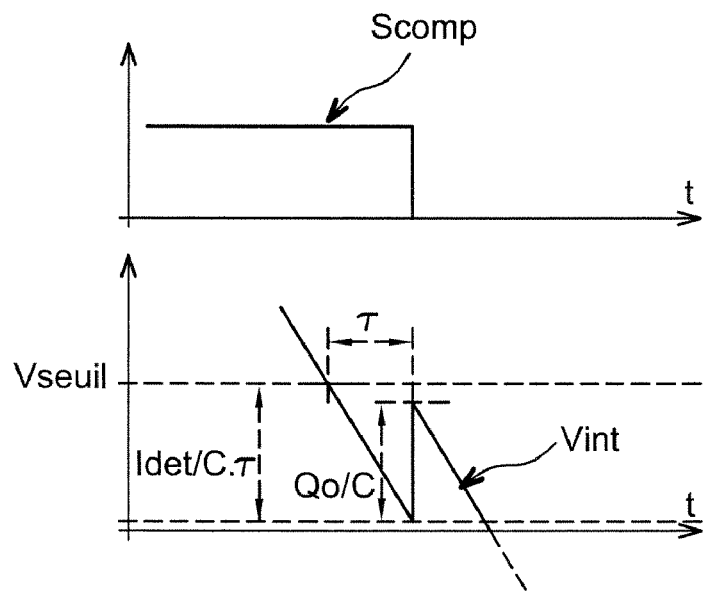
FIG. 5 illustrates a blocking of a comparator, from which the analog/digital converter according to the invention can prevent.

The digitization applied by the converter according to the invention is not very sensitive or insensitive to the rapidity of the comparator 120 or to the triggering delay τ of the comparator 120, and unlike the devices according to the prior art, it is possible to provide protection against a blocking, as illustrated in FIG. 5, of an output signal Scomp of a comparator, when the current $I_{DET}$ at the output of the detector is such that $I_{DET}\tau > Q_O$.

FIG. 6 in particular illustrates the second operating mode of the analog conversion device for detection currents such as $I_{DET}\tau > Q_O$.

In the same way as for the first operating mode, when the integration capacitor 110 receives charges from the detector 50, the voltage Vint or the analog signal Vint varies, for example decreases. Such a variation is for example illustrated by a decreasing curve portion 242 in FIG. 6.

Next, consecutive to this variation, when the analog signal or the voltage Vint reaches a certain threshold, for example passes below a threshold voltage Vseuil of the comparator 160, the output of the latter switches after a delay noted as τ. During this switching, the signal Scomp at the output of the comparator passes from the first state, a so-called <<stable>> state, for example a high state, to the second state, for example a low state. Such switching is for example illustrated by a falling edge 253 in FIG. 6.

The command block 170 applies a detection of the switching or of the state change from the first state to the second state of the signal Scomp. Next, in order to compensate the variation of the signal Vint, the command block 170 triggers a first charge injection by the means 190, the latter dumping into the integration capacitor 110 a fixed charge $Q_0$ opposed to the preceding variation of Vint.

The first charge injection is expressed by a rise (portion of the curve referenced as 244) of the Vint signal by a value of the order of $Q_0/C$. In FIG. 6, consecutive to the first injection, the Vint signal does not reach a value larger than the threshold voltage of the comparator 160, or required for allowing retriggering of the comparator 160 or for allowing the signal Scomp to change state and for example find the first state or the stable state again. Consecutive to the first injection, the signal Scomp is held in the second state.

After the first injection, the command block 170 performs a detection of the state of the Scomp signal. The command block 170 may then detect the holding of the signal Scomp in the second state, and trigger consecutive to this detection and via the phase signals Φ1 and Φ2, a second injection (vertical portion referenced as 245) of a quantity of charges $Q_0$ by the injector 190.

Consecutive to the second injection of charges $Q_0$, the Vint signal does not always reach a value larger than the threshold voltage, or required for allowing retriggering of the comparator 160. The signal Scomp is held in the second state consecutive to the second injection.

The command block 170 may then apply a new detection of the state of the Scomp signal after this second injection.

Consecutive to this new detection, and via the phase signals Φ1 and Φ2, a third injection (vertical portion referenced as 246) of a quantity of charges $Q_0$ is triggered by the injector 190.

This third injection of charges causes a new rise of the Vint signal by a value of the order of $Q_0/C$. Consecutive to this new rise, the signal Vint reaches a value larger than the threshold voltage and sufficient for allowing retriggering of the comparator 160 or for allowing the signal Scomp to change state (rising edge referenced as 257) and for example find the first state or the stable state again. The command block 170 is then capable of applying a detection of the state of the signal Scomp. The command block 170 may detect the state change to the first state or the return to the stable state of the signal Scomp. The command block 170 consecutive to this detection and via the phase signals Φ1 et Φ2 may also trigger a setting of the injector 190 in a standby mode or a setting of the injector 190 in a condition in which the latter cannot perform any injection while the signal Scomp is held in the stable state.

In this second operating mode, the block 170 is capable of triggering several injections of charges while the signal Scomp at the output of the comparator is found in the second state and has not found its stable state again.

The command blocks or means 170 according to the two-states signal Scomp, are capable of triggering several injections of charges Q between at least two successive changes in state of the Scomp signal, from the first state to the second state and from the second state to the first state.

A ΔΣ modulator 120 capable of retriggering or triggering again the comparator 160, when the latter receives at the input significant variations of the detection current Idet or significant values of the detection current Idet, is thereby applied.

Such an analog/digital conversion device provides digitization of the detection currents $I_{DET}$ such that $I_{DET}\tau > Q_0$ and is thereby provided with improved dynamic range. Such an analog/digital conversion device is also provided with enhanced robustness towards sudden variations of the analog signal Vint at the terminals of the integration capacitor 110.

Figure 7:
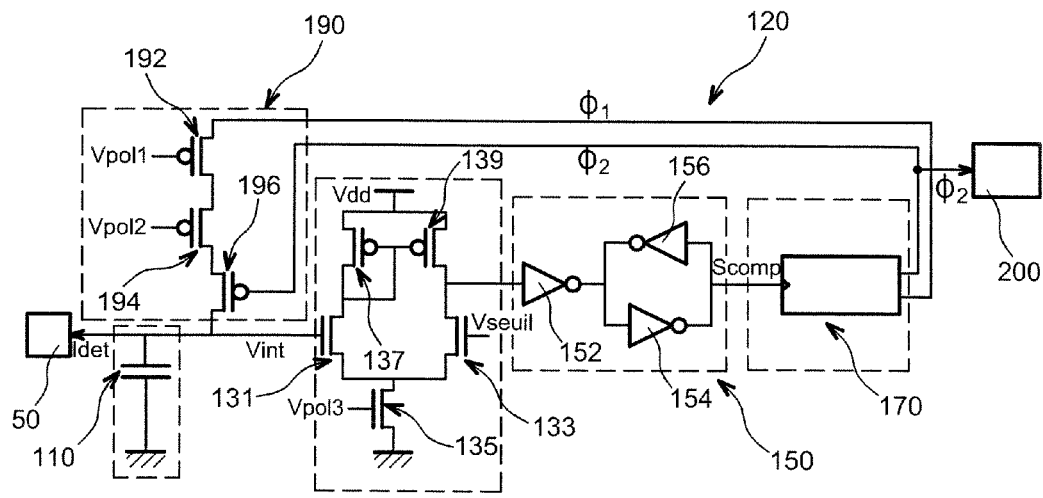
FIG. 7 illustrates an exemplary embodiment of an analog/digital conversion device according to the invention, integrated to at least one pixel of an imager.

FIG. 7 shows an exemplary embodiment of the digitization device according to the invention, as described earlier.

The ΔΣ modulator 120 may be made in CMOS (Complementary Metal Oxide Semiconductor) technology and comprises a comparator 160, formed with a differential amplifier 130 and a triggering circuit 150, commonly called a <<trigger>> circuit, located at the output of the differential amplifier 130.

The differential amplifier 130 may be formed for example with 5 transistors 131, 133, 135, 137, 139. A first transistor 131, for example of the NMOS type, and a second transistor 133, for example of the NMOS type, form a differential pair and have a common source electrode. The first transistor 131 located at the input of the differential amplifier 130 is connected to the integration capacitor 110 and receives the analog signal Vint on its gate, whereas the gate of the second transistor 133 is set to a voltage Vseuil, defining the switching voltage of the comparator 160. The source electrode common to the first NMOS transistor 131 and to the second NMOS transistor 133 is also connected to the drain of a third NMOS transistor 135, the gate of which is set to a fixed potential Vpol3. The differential amplifier 130 also comprises a fourth transistor 137, for example of the PMOS type and a fifth transistor 139, for example of the PMOS type. The fourth transistor 137 and the fifth transistor 139 are laid out or mounted as a current mirror. The fourth transistor 137 and the fifth transistor 139 also share a common source region, set to a fixed potential Vdd. The drain electrodes of the fourth transistor 137 and of the fifth transistor 139 are as for them connected to the drain electrode of the first transistor 131 and to the drain electrode of the second transistor 133, respectively. The fourth transistor 137 also has a gate electrode and a drain electrode connected together.

The output of the differential amplifier 130 may be taken at the drain electrode of the fifth transistor 139 and at the drain electrode of the second transistor 133. The output of the amplifier 130 is connected to an input of the trigger circuit 150. This trigger circuit 150 may be formed for example with three inverters 152, 154, 156. A first inverter 152 is connected to the output of the differential amplifier 130, and connected in series with a set of two other inverters 154, 156. The two other inverters 154 and 156 are positioned in parallel, and so that the output of one of the two inverters 154 and 156 is connected to the output of the other of the two inverters 154 and 156. The trigger circuit 150 delivers at the output the digital or two-states Scomp signal.

In this exemplary embodiment, the charge injector means 190 may as for them be formed with transistors 192, 194, 196, driven or commanded by the two-states signals Φ1 and Φ2 from the command block 170. The charge injector means 190 may notably comprise a first transistor 192 of the PMOS type, the source of which is connected to the first output of the block 170 delivering the signal Φ1 and the gate of which is set to a fixed polarization potential Vpol1. The charge injector means 190 may also comprise a second transistor 194, in series with the first transistor 192 and the source of which is connected to the drain of the first transistor 192. The gate of the second transistor 194 is set to a fixed potential Vpol2, less than the potential Vpol1.

The first transistor 192 and the second transistor 194 are commanded by the first phase signal Φ1 and may form the means for storing a fixed charge $Q_0$ for the injector 190. The charge injector 190 also comprises a third transistor 196, the gate of which is connected to the second output of the command block 170 delivering the signal Φ2, and the drain of which is connected to the first electrode of the integration capacitor 110. The third transistor 196 commanded by the signal Φ2 may form the switching means of the charge injector 190.

This charge injector 190 may have cyclic operation and is capable of assuming, in turn, different states or different operating phases, e.g. 4 operating phases.

Figure 8:
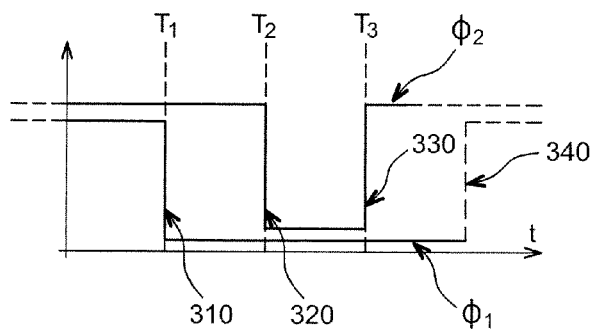
FIG. 8 illustrates a 4-phase operation of a charge injector belonging to a digitization device according to the invention.

FIG. 8 illustrates via a time diagram, the phases of an operating cycle of the charge injector 190, depending on an example for the change over time of the respective states of the phase signals Φ1 and Φ2 delivered by the command block 170.

In a first time interval of the time diagram, up to an instant $T_1$, the charge injector 190 is in a first operating phase, a so-called <<filling>> phase. During this first phase, the second phase signal Φ2 is set to a first state, for example a high state, with which the switching means of the injector 190 may be kept open (for example as a transistor 196 illustrated in FIG. 8). During the first phase, the first phase signal Φ1 is as for it set to a first state, for example a high state, allowing the charge storage means (for example as transistors 192, 194 illustrated in FIG. 8) to store a certain quantity of charges.

Then, at instant T1, the first phase signal Φ1 changes state (a falling edge referenced as 310) and passes into a second state, for example a low state. This state change of the signal Φ1 causes the injector 190 to enter a second operating phase. During a second time interval ]T1; T2[, the charge injector 190 is found in the second operating phase, a so-called <<skimming>> phase. During this second phase, the signal Φ2 is held in the first state, which allows the switch of the charge injector 190 to remain open. The signal Φ1 is, as for it, set to the low state for which the charge storage means only retain a fixed portion or quantity of charges $Q_0$, of the certain quantity of charges stored during the first phase.

Next, at instant T2, the second phase signal Φ2 changes state (a falling edge referenced as 320), and for example passes to a low state. This state change of the signal Φ2 causes the injector 190 to enter into a third operating phase. During a third time interval ]T2; T3[, the charge injector 190 is placed in the third operating phase, a so-called <<charge transfer>> phase. During this third phase, the signal Φ1 is held in the second state, for example the low state, for which the charge storage means are capable of dumping the fixed quantity of charge $Q_0$. The signal Φ2 is, as for it, set to a second state, for example the low state, capable of keeping the switch of the injector 190 closed (as the transistor 196), and of allowing the fixed quantity of charges $Q_0$ to be dumped into the integration capacitor 110.

Next, at instant T3, the second phase signal Φ2 changes state, and passes (an edge referenced as 330) for example to the first state, for example to the high state. This state change of the signal Φ2 causes the injector 190 to enter a fourth operating phase. During a fourth time interval ]T3; T4[, the charge injector 190 is found in the fourth operating phase, a so-called phase for <<isolating the integration capacitor>>. The signal Φ2 is set to a state, with which the switch (as the transistor 196) of the injector 190 may be kept open and the charge storage means may be isolated from the integration capacitor 110.

Next, the first phase signal Φ1 changes state again (edge referenced as 340), and for example passes to the first state, for example the high state. This new state change of the signal Φ1 engages the injector 190 in a new cycle.

The four operating phases of the injector 190 may have respective durations different from each other.

From a skimming phase to another skimming phase of the cyclic operation of the injector 190, the quantity of charge stored $Q_0$ by the charge injector 190 is preferably the same or substantially the same. In other words, the quantities of charges stored by the charge storage means 192 and 194 during the different skimming phases of the injector 190, are preferably equal to each other or substantially equal to each other and to $Q_0$.

Figure 9:
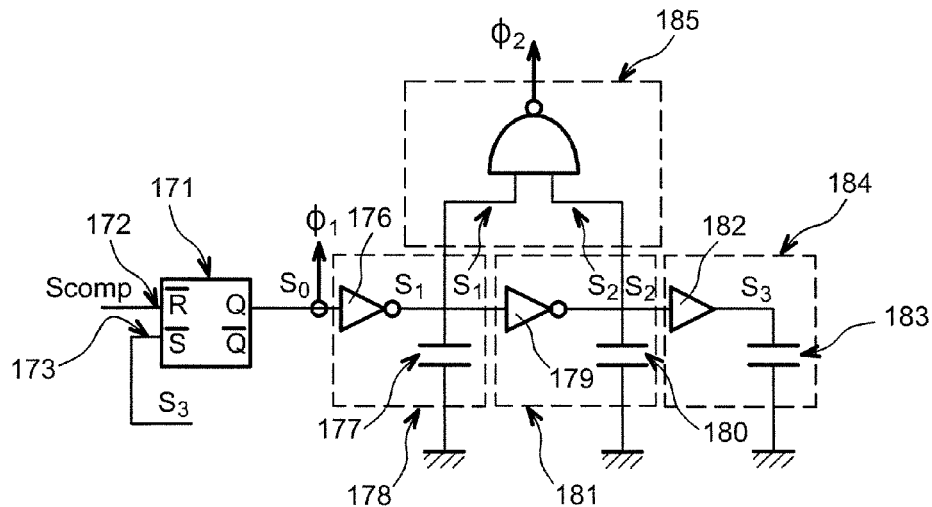
FIG. 9 illustrates an exemplary embodiment of command means of a charge injector, in an analog/digital conversion device according to the invention, integrated to at least one pixel of an imager.

An exemplary embodiment of the command block 170 is illustrated in FIG. 9. The block 170 is clock-free and/or has an asynchronous operation. The block 170 first of all includes in this example, a flip-flop 171 of the RS flip-flop type, which may for example be formed by first and second NAND gates (not shown). The flip-flop 171 includes a first input 172 and a second input 173. The first input 172, a so-called <<reset>> or <<R>> input, corresponds to an input of the second NAND gate and is intended to receive the output Scomp signal of the comparator 172. The second input 173 of the flip-flop 171, a so-called <<set>> or <<S>> input, as for it corresponds to an input of the first NAND gate and is intended to receive a signal S3, depending on or function of a signal S0 emitted on a first output 174 of the flip-flop 171.

The first output 174 of the flip-flop 171, corresponds to the output of the first NAND gate, or has an output commonly called the <<Q>> output of the flip-flop 171. The first output 174 of the flip-flop 171 is connected to a succession of cells 178, 181, 184, so-called <<delay>> cells, positioned in series.

Among the delay cells 178, 181, 184, appears a first cell 178, connected to the output 174 of the flip-flop 171. The first cell 178 receives the signal S0 at the output 174 of the flip-flop 171 and delivers a signal S1 at the input of a second cell 181.

The first cell 178 consecutive to the reception of a falling edge of the signal S0 at the output of the flip-flop 171, may for example be provided for transmitting at the output a rising edge, with a delay of $\Sigma_{LH1}$. The first cell 178 may also be provided, consecutive to the reception of a rising edge of the signal S0 at the output of the flip-flop 171, for transmitting at the output a falling edge with a transfer delay $\tau_{HL1}$ different from $\tau_{LH1}$. The transfer delays $\tau_{HL1}$ and $\tau_{LH1}$ may be adjusted so that $\tau_{LH1}$ is larger than or much larger than $\tau_{HL1}$. The delay $\tau_{LH1}$ may for example be ten times longer or at least hundred times longer than the delay $\tau_{HL1}$. The first cell 178 may for example be formed by an inverter 176 and a capacitor 177.

The second cell 181 at the output of the first cell 178 is capable of delivering a signal S2 to a third cell 184. The second cell 181 consecutive to the reception of a falling edge of the signal S1 at the output of the first cell 178, may for example be provided for transmitting at the output a rising edge with a delay of $\tau_{LH2}$. The second cell 181 consecutive to the reception of a rising edge of the signal S1 at the output of the first cell 177, may also be provided for transmitting at the output a falling edge with a transfer delay $\tau_{HL2}$ different from $\tau_{LH2}$. The second cell 181 may be applied so that $\tau_{HL2}$ is longer than or much longer than $\tau_{LH2}$. The delay $\tau_{HL2}$ may for example be at least ten times longer or at least hundred times longer than the delay $\tau_{LH2}$. The second cell 181 may for example be formed by an inverter 179 and a capacitor 180.

The third cell 184, in series with the second cell 181, is capable of delivering the signal S3. The third cell 184 is connected to the <<set>> or <<S>> input 173 of the flip-flop 171 and allows the signal S3 to be delivered on this input 173.

The signal S3 is capable of indicating the end of an operating cycle of the injector.

The third cell 184 may for example be provided for transmitting with a transfer delay $\tau_{HL3}$, a falling edge of the signal S2 at the output of the second cell 181. The third cell 184 may also be provided for transmitting with a transfer delay $\tau_{LH3}$ different from $\tau_{HL3}$, a rising edge of the signal S2 at the output of the second cell 181. The transfer delays $\tau_{HL3}$ and $\tau_{LH3}$ may be adjusted so that $\tau_{LH3}$ is longer than $\tau_{HL3}$ or is much longer than $\tau_{HL3}$. The delay $\tau_{LH3}$ may for example be at least ten times longer or at least hundred times longer than the delay $\tau_{HL3}$. The third cell 184 may for example be formed by a follower 182 and a capacitor 183.

The output signal S0 of flip-flop 171 is also emitted at the output of the command block 170 and corresponds or is equal to the first phase signal Φ1, for commanding charge storage means of the injector 190. The outputs of the first cell 178 and of the second cell 181, are, as for them, connected to a block 185 providing a logic function for example a NAND or <<non-and>> function between the signal S1 and the signal S2. The block 185 emits a signal $\overline{S1 \cdot S2}$ equal to or corresponding to the second phase signal Φ2 for commanding the injector 190, and in particular of the switch of this injector.

The transfer delays $\tau_{LH1}, \tau_{LH2}, \tau_{LH3}, \tau_{HL1}, \tau_{HL2}, \tau_{HL3}$ of the cells 178, 181, 184, are adjusted according to the respective durations of the operating phases of the injector 190 as described earlier, which one desires to obtain.

Several delays from the transfer delays $\tau_{LH1}, \tau_{LH2}, \tau_{LH3}, \tau_{HL1}, \tau_{HL2}, \tau_{HL3}$, of the cells 178, 181, 184, may be adjusted according to a duration corresponding to a cumulative duration noted as $\tau_1$ of the first operating phase, of the second operating phase and of the third operating phase of the injector 190, or to a duration during which the first phase signal Φ1 is set to the second state, for example the low state. The cumulative duration $\tau_1$ of the first operating phase, of the second operating phase and of the third operating phase of the injector 190 may for example be such that:

$$\tau_1 \approx \tau_{LH1} + \tau_{LH2} + \tau_{HL3}.$$

Several delays from the transfer delays $\tau_{LH1}, \tau_{LH2}, \tau_{LH3}, \tau_{HL1}, \tau_{HL2}, \tau_{HL3}$, of the cells 178, 181, 184, may be adjusted according to a duration $\tau_2$, corresponding to the duration of the third operating phase of the injector 190 or the phase for charge transfer, or to a duration during which the second phase signal Φ2 is set to the second state, for example the low state. The duration $\tau_2$ may for example be such that: $\tau_2 \approx \tau_{HL2} + \tau_{HL2} + \tau_{HL3}$. $\tau_{HL3}$ may correspond to the duration for resetting the potentials or the signals of the command block 170.

Figure 10:
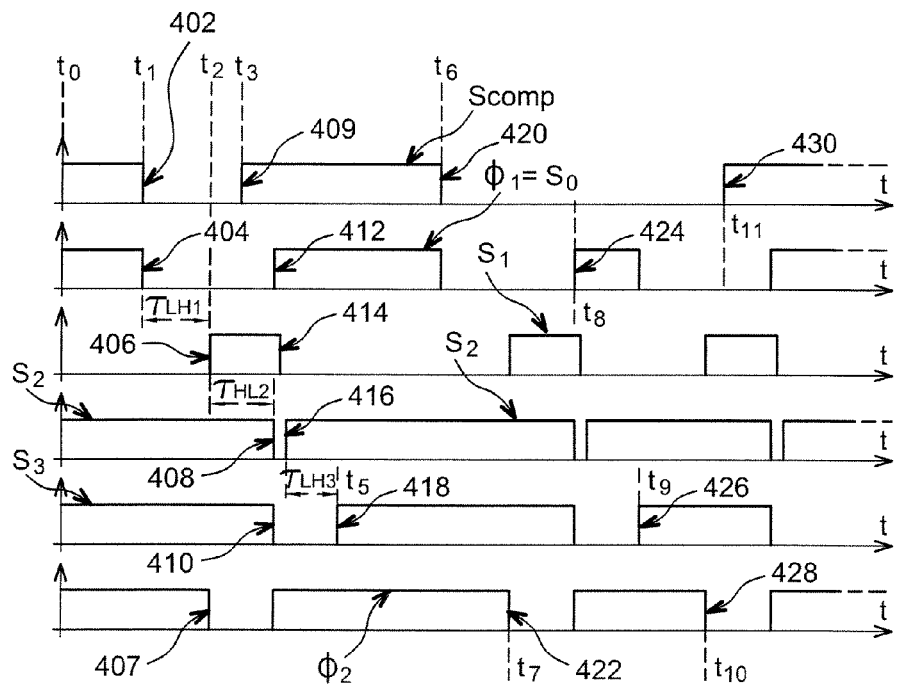
FIG. 10 illustrates an exemplary time diagram of the change in the signals produced by the command means of a charge injector within a digitization device according to the invention.

FIG. 10 illustrates an operation of the command block 170 as described earlier, via an example of a time diagram of the change over time in the signals S0, S1, S2, S3, produced inside this command block 170, and signals Φ1=S0, Φ2=$\overline{S1 \cdot S2}$, delivered at the output of the command block 170 (as described earlier in connection with FIG. 9), depending on the change of the Scomp signal at the output of the comparator 160.

As this was described earlier, the signal Scomp may be a two-states signal, capable of assuming a first state a so-called <<stable state>> or a second state, depending on the variations of the analog signal Vint (not shown in this figure).

Between an instant t0 and an instant t1 on the time diagram, the signal Scomp is found in the first state or <<stable state>>, for example the high state.

Next, at instant t1, the signal Scomp at the output of the comparator 160 changes state and passes (falling edge referenced as 402 in FIG. 10) to a second state, for example a low state.

The command block 170 carries out detection of this state change.

This state change is expressed by a command edge which propagates through the flip-flop 171 and causes a state change of the first phase signal Φ1=S0, the latter for example passing to a low state (falling edge referenced as 404). The state change of the first phase signal Φ1 causes the injector 190 to enter its second operating phase or <<skimming>> phase as described earlier.

The state change of the first phase signal Φ1 to the low state, also causes after the delay $\tau_{LH1}$, a state change to the high state (rising edge referenced as 406) of the signal S1 and a state change to the low state (falling edge referenced as 407) of the signal Φ2. This state change of the signal Φ2, causes the injector 190 to enter its third operating phase, in other words it causes a first charge injection at instant t2 or from instant t2.

This first charge injection changes the analog signal Vint at the input of the comparator 160 and for example causes a rise in the signal Vint. As indicated by a rising edge referenced as 409 at instant t3, this rise of the analog signal Vint causes a state change of the signal Scomp at the output of the comparator 160, and allows the signal Scomp to return to the first state or to a <<stable>> state.

The command edge as for it propagates as far as the output of the second cell 181. Thus, state change to the high state (edge referenced as 406) of the signal S1 causes after a certain delay $\tau_{HL2}$, a state change of the signal S2 to the low state (falling edge referenced as 408 in FIG. 10) and a state change of the signal Φ2. This state change of the signal Φ2 causes the injector 190 to enter its fourth operating phase.

The command edge then propagates as far as the output of the third cell 184. Thus, the state change to the low state (edge referenced as 408) of the signal S2 causes after a certain delay $\tau_{HL3}$ (not referenced in FIG. 10), a state change of the signal S3 to the low state (falling edge referenced as 410 in FIG. 10).

The delay $\tau_{HL3}$ may be chosen to be less or much less or negligible relatively to the delays $\tau_{LH1}$ and $\tau_{HL2}$.

The signal S3 at the output of the third cell 184 is then re-emitted at the input of the block 170, and in particular, at the <<set>> or <<S>> input 173 of the flip-flop 171.

After the first charge injection, the command block 170 applies at least one detection of the state of the Scomp signal at the output of the comparator 160.

As this Scomp signal has returned to the stable state or to the first state after the first charge injection, the signal S0 at the output of the flip-flop 171 changes state (rising edge referenced as 412), which causes the injector 190 to return to its first operating phase.

The state change to the high state of the signal S0 causes, after the delay $\tau_{HL1}$ (not referenced in FIG. 10), a state change to the low state (falling edge referenced as 414 in FIG. 10) of the signal S1, the state change to the low state of the signal S1 causing after the delay $\tau_{LH2}$ (not referenced in FIG. 10), a state change to the high state (falling edge referenced as 416) of the signal S2, the state change to the high state of the signal S2 causing, after the delay $\tau_{LH3}$, a state change of the signal S3 (rising edge referenced as 418).

The delays $\tau_{HL1}$ and $\tau_{LH2}$ may be chosen to be less or much less or negligible relatively to the delay $\tau_{LH3}$.

At an instant t5, the signal Scomp at the output of the comparator 160, is found in the first state or the <<stable>> state or in the high state, whereas the signal S3 emitted on the <<Set>> input 173 of the flip-flop 171 passes to a high state. This state change causes a memory or memorization effect. The signal S0 at the output of the flip-flop remains the same or does not change, while the signal Scomp at the output of the comparator 160 does not change state. The injector 190 remains in its first operating condition while the signal Scomp does not change state. The command block 170 thereby performs a setting to a standby mode or a waiting mode of the injector 190 or places the injector 190 in a condition in which it cannot carry out any charge injection while the Scomp remains in the stable state. During this setting in a standby mode, the injector 190 may be held in its first operating phase.

Between an instant t5 and an instant t6 of the time diagram, the signal Vint (not shown in FIG. 10) varies according to a given range, depending on a light intensity detected by the detector 50.

This variation causes at instant t6, a state change of the signal Scomp (falling edge 420 in FIG. 10) at the output of the comparator 160, which allows a new command edge of the injector 190 to be generated. This new command edge provides a trigger for resuming the operating cycle of the injector 190. With the new command edge, it is possible to cause a second injection of charges (falling edge of the signal Φ2 referenced as 422) at instant t7 or from instant t7. Said second cycle of the injector 190 ends at instant t8 (rising edge referenced as 424 of signal Φ1). After the second charge injection, the command block 170 applies a detection of the state of the signal Scomp. At an instant t9, the signal Scomp has not returned to its stable state or to the high state. Another new command edge is then re-launched. This other new command edge provides a trigger for resuming the operating cycle of the injector 190. With this other new command edge, it is possible to cause a third injection of charges (rising edge referenced as 428, of signal Φ2 in FIG. 10) at an instant t10 or from an instant t10.

At an instant t11, as this suggested by a rising edge referenced as 430, with the third charge injection, it was possible to cause a return of the signal Scomp to the stable state.

According to one alternative embodiment of the command block 170, the latter may be in the form of an oscillator activated by the signal Scomp. This oscillator may be applied so that, after a state change of the Scomp signal from the first state to the second state, and as long as the Scomp signal at the output of the comparator 160 is found in the second state, for example in the low state, the oscillator generates command edges, so as to generate phase signals Φ1 and Φ2 for commanding the injector as described earlier. The oscillator may also be applied so that, when Scomp is found in the stable state again or passes from the second state to the first state, it stops generating edges or oscillating. Such an oscillator may for example be an astable multivibrator.

The invention claimed is:

1. An image sensing microelectronic device comprising:
   at least one detector including at least one photodetector element, at least one integration capacitor associated with the photodetector element and configured to deliver at least one analog signal able to vary at least in relation to quantities of photons received by the photodetector element, and clock-free or asynchronous analog/digital conversion means comprising:
      a comparator configured to receive an analog signal from an integration capacitor and to deliver a two-states output signal which, in relation to the analog signal, is able to be in a first stable state or in a second state,
      charge injector means configured to modify the analog signal by injecting at least a quantity of charges into the capacitor, and
      an asynchronous command means commanding the charge injector means, configured to receive the two-states signal and configured to command the injector means, the asynchronous command means comprising:
         means for identifying at least one state change of the signal output by the comparator, from the first state to the second state, and
         means for triggering automatically and asynchronously, consecutive to the state change, plural consecutive charge injections by the injector for as long as the output signal leaving the comparator is held in the second state.

2. An image sensing microelectronic device according to claim 1, wherein quantities of charges injected during the charge injections are equal.

3. An image sensing microelectronic device according to claim 1, the command means being configured, when the output signal of the comparator lies in the second state just after having been in the first state for a given time, to command a number k (where k≧1) of charge injections until the output signal from the comparator changes state or enters the first state, the number k being dependent on a variation amplitude of the analog signal during the given time.

4. An image sensing microelectronic device according to claim 1, the command means of the charge injector means comprising:
means forming at least one trigger,
means forming one or more delay cells, and
means forming at least one logic gate.

5. An image sensing microelectronic device according to claim 1, the command means of the charge injector means comprising an oscillator commanded by the output signal of the comparator.

6. An image sensing microelectronic device according to claim 1, wherein the command means is configured to command the injector means via at least one first phase signal and at least one second phase signal, the first phase signal and the second phase signal being two-states signals.

7. An image sensing microelectronic device according to claim 6, further comprising:
counting means, for counting a number of charge injections performed by the injector means, from the first phase signal or/and from the second phase signal.

8. An image sensing microelectronic device according to claim 1, the photodetector element and the conversion means being integrated in one same pixel or/and one same chip or/and belonging to one same integrated circuit.

9. An image sensing microelectronic device according to claim 1, the photodetector element being configured to detect at least one radiation chosen from among the following radiations: infrared radiation, X-radiation.

10. A command method of an analog/digital converter device integrated in an image sensor and associated with a detector including at least one photodetector element, an asynchronous or clock-free analog/digital converter device comprising:
at least one integration capacitor,
a comparator configured to receive an analog signal from the integration capacitor and to deliver a two-states output signal which, in relation to the analog signal, is able to assume a first state or a second state,
charge injector means configured to modify the analog signal by injecting at least one quantity of charges into the capacitor,
an asynchronous command means commanding the charge injector means, configured to receive the two-states signal,
the method comprising:
identifying a state change of the comparator output signal from the first state to the second state; and
triggering automatically and asynchronously, consecutive to the state change, plural consecutive charge injections for as long as the output signal from the comparator is held in the second state.

11. A command method of an analog/digital converter according to claim 10, wherein quantities of charges injected during the charge injections are equal.

12. A command method of an analog/digital converter according to claim 10, wherein when the comparator output signal lies in the second state just after having been in the first state for a given time, the method comprises: triggering of a number k of charge injections, in which $k \geq 1$, until the two-states signal again changes state, the number k being related to a variation amplitude of the analog signal during the given time.

13. A command method of an analog/digital converter according to claim 10, further comprising:
counting the number of charge injections performed by the injector means via a first phase signal or/and a second phase signal delivered by the command means of the injector means.

14. A command method of an analog/digital converter according to claim 10, the photodetector element being configured to detect at least one radiation chosen from among the following radiations: infrared radiation, X-radiation.

* * * * *